United States Patent
Murase et al.

(10) Patent No.: US 7,920,031 B2
(45) Date of Patent: Apr. 5, 2011

(54) CRYSTAL DEVICE FOR SURFACE MOUNTING

(75) Inventors: Shigeyoshi Murase, Saitama (JP); Chisato Ishimaru, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 95 days.

(21) Appl. No.: 12/384,514

(22) Filed: Apr. 6, 2009

(65) Prior Publication Data

US 2009/0261912 A1    Oct. 22, 2009

(30) Foreign Application Priority Data

Apr. 16, 2008  (JP) ................ 2008-106945

(51) Int. Cl.
*H03B 1/00* (2006.01)
*H03B 5/32* (2006.01)

(52) U.S. Cl. .................. 331/68; 331/158; 310/311

(58) Field of Classification Search .......... 331/68, 331/69, 158; 310/311, 365, 348, 340, 344
See application file for complete search history.

(56) References Cited

U.S. PATENT DOCUMENTS 6,452,311 B1 * 9/2002 Serizawa .............. 310/363
6,998,926 B2 * 2/2006 Miyazaki et al. ........ 331/68

FOREIGN PATENT DOCUMENTS

| JP | 2003-068921 A | | 3/2003 |
| JP | 2003218265 A | * | 7/2003 |
| JP | 2003-243559 A | | 8/2003 |
| JP | 2006-303919 | | 11/2006 |

\* cited by examiner

*Primary Examiner* — Robert Pascal
*Assistant Examiner* — Ryan Johnson
(74) *Attorney, Agent, or Firm* — Carrier Blackman & Associates, P.C.; Joseph P. Carrier; William D. Blackman

(57) ABSTRACT

A surface-mounted device includes a ceramic case, which has a concave portion formed by a bottom wall layer, a frame wall intermediate layer and a frame wall upper layer, and which houses at least a crystal element inside the concave portion. The ceramic case includes: arc-formed notched parts at outer circumference four corners thereof; and mounting terminals, which are extended to notched parts in the bottom wall layer among the notched parts, on an outer bottom face thereof. A radius of curvature of the notched parts in the frame wall intermediate layer is made identical to or greater than a radius of curvature of the notched parts in the bottom wall layer, and a radius of curvature of the notched parts in the frame wall upper layer is less than the radii of curvature of the notched parts in the bottom wall layer and the frame wall intermediate layer.

5 Claims, 4 Drawing Sheets

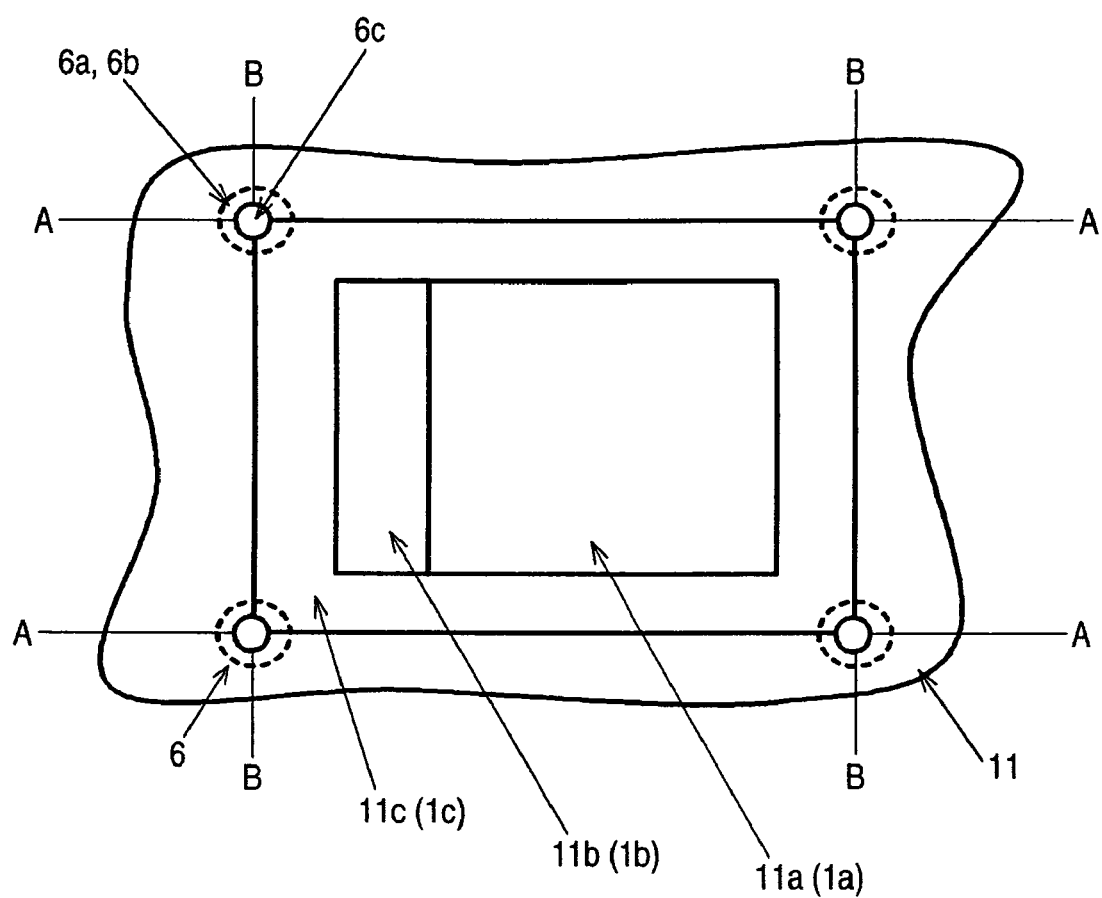

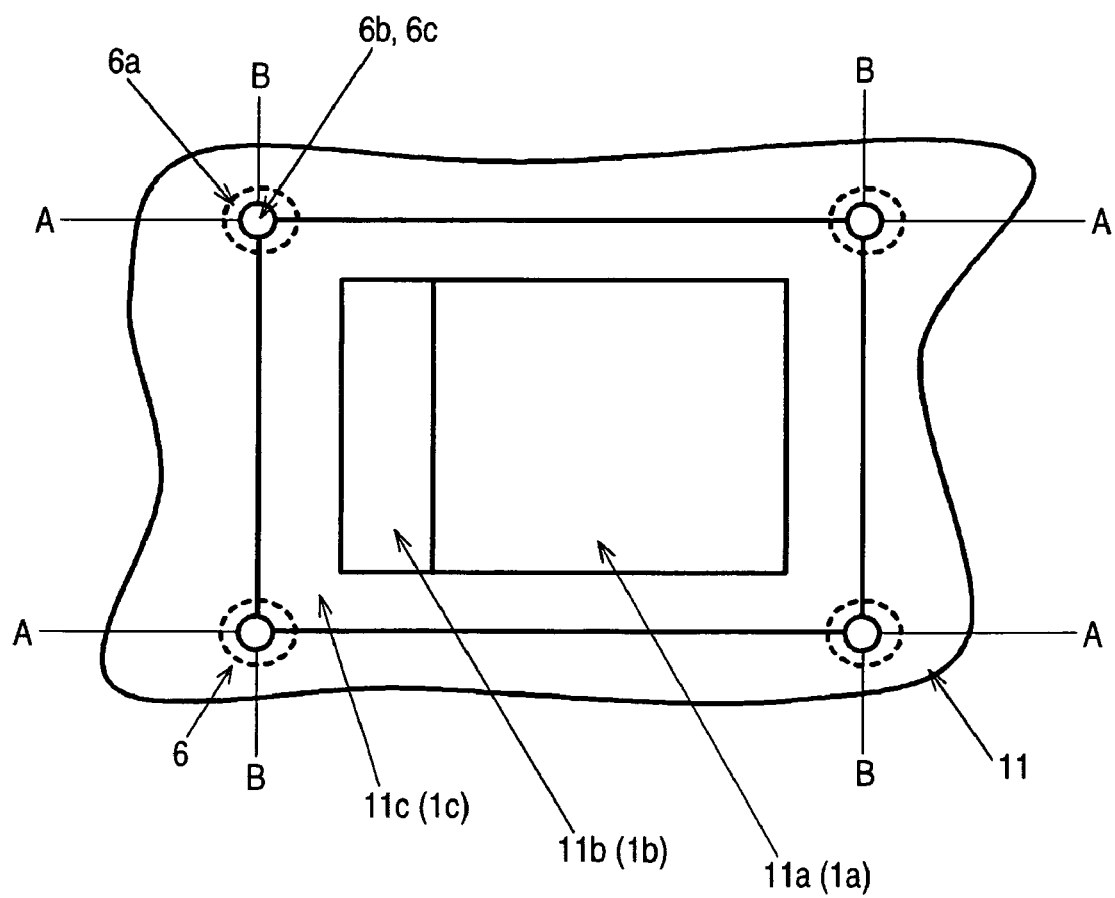

CRYSTAL DEVICE FOR SURFACE MOUNTING

This application claims priority from Japanese Patent Application No. 2008-106945 filed on Apr. 16, 2008, the entire subject matter of which is incorporated herein by reference.

BACKGROUND OF THE INVENTION

1. Field of the Invention

The invention relates to a technical field of a crystal device for surface mounting which is appropriate for miniaturization, and in particular, to a ceramic case 1 having end face electrodes for forming solder fillets thereon.

2. Description of the Related Art

A crystal device for surface mounting such as a crystal unit, a crystal oscillator, or a crystal filter is known as a frequency control element. For example, a crystal oscillator for surface mounting (hereinafter, referred to as a surface-mounted oscillator) is built into various types of electronics as a source of frequency or as a time reference. In recent years, the miniaturization thereof has been further advanced, which has brought about their planar outlines which are 2.0×1.6 mm or less, for example.

FIGS. 3A to 3C are diagrams for explanation of one example of a related art surface-mounted oscillator. FIG. 3A is a cross-sectional view of the related art surface-mounted oscillator, FIG. 3B is a plan view of the relate art surface-mounted oscillator without a metal cover, and FIG. 3C is a plan view of the related art surface-mounted oscillator to which the metal cover is jointed.

The related art surface-mounted oscillator 200 is configured such that, a crystal element 2 and an IC chip 3 are housed in a ceramic case 1 in a rectangular form in plan view whose cross section is formed to be concave and which has an inner wall shoulder, and a metal cover 4 is jointed to the ceramic case 1 to hermetically encapsulate the crystal element 2 and the IC chip 3. The ceramic case 1 includes a bottom wall layer 1a, a frame wall intermediate layer 1b, and a frame wall upper layer 1c. Mounting terminals 5 are provided to the four corners of the outer bottom face in the ceramic case 1 (bottom wall layer 1a), that are extended as end face electrodes 5a for solder fillets on the corners of the bottom wall layer 1a.

Generally, the ceramic case 1 is formed such that, as shown in an enlarged partial plan view of FIG. 4, in a state of a ceramic green sheet, a sheet-like bottom wall layer 11a, a sheet-like frame wall intermediate layer 11b, and a sheet-like frame wall upper layer 11c are laminated to form a sheet-like ceramic case 11, and thereafter, the sheet-like ceramic case 11 is divided into separate ceramic cases 1. Through holes 6 (6a, 6b and 6c) passing through the both principal surfaces are formed in the respective intersections on the parting lines shown by A-A and B-B of the sheet-like ceramic case 11.

In this case, the through holes 6 of the sheet-like ceramic case 11 are formed such that a radius of curvature of a through hole 6a in the sheet-like bottom wall layer 11a is greater than a radius of curvature of through holes 6b and 6c in the sheet-like frame wall intermediate layer 11b and the sheet-like frame wall upper layer 11c. Then, a base electrode of, for example, W (tungsten) or the like, in a circuit pattern (not shown) is formed on the sheet-like bottom wall layer 11a, the sheet-like frame wall intermediate layer 11b, and the sheet-like frame wall upper layer 11c by printing. At this time, the base electrode is also formed on the inner circumferential surfaces of the through holes 6a in the sheet-like bottom wall layer 11a.

Thereafter, after the sheet-like bottom wall layer 11a, the sheet-like frame wall intermediate layer 11b, and the sheet-like frame wall upper layer 11c are laminated, the sheet-like ceramic case 11 is submerged into an electrolyte, and Ni (nickel) and Au (gold) layers are serially plated onto the base electrode. Thereby, plated layers are formed on the base electrode exposed on the surface of the sheet-like ceramic case 11.

Then, the end face electrodes 5a for forming solder fillets thereon, which are extended from the mounting terminals 5, are formed in the respective through holes 6a in the sheet-like bottom wall layer 11a. Thereafter, the sheet-like ceramic case 11 is divided to obtain ceramic cases 1 having arc-formed notched parts 6' into which the through holes 6 are respectively divided into four on their outer circumference four corners.

Since the through holes 6a in the sheet-like bottom wall layer 11a are made for solder fillets, the through holes 6a are made greater than the through holes 6b and 6c in the sheet-like frame wall intermediate layer 11b and the sheet-like frame wall upper layer 11c, to make a surface area of the divided end face electrodes greater. Further, the through holes 6b and 6c in the sheet-like frame wall intermediate layer 11b and the sheet-like frame wall upper layer 11c make the electrolyte easy to flow therein, and prevent burrs from occurring, for example, when the sheet-like ceramic case 11 is divided.

The crystal element has leading electrodes 7 on the both principal surfaces, and extractor electrodes 8 are extended on the both sides of one end thereof. The extended both sides of the one end of the extractor electrodes 8 are fixed to the inner wall shoulder (frame wall intermediate layer 1b) in the ceramic case 1 by an electrically conductive adhesive 9. The IC chip 3 in which at least oscillator circuits are integrated is fixed to the inner bottom face of the ceramic case 1 by flip-chip bonding.

The metal cover 4 is seam-welded to a metal ring 10 provided on an end face of the opening (surface of the frame wall upper layer 1c) of the ceramic case 1. A metal film 13 is provided to the end face of the opening of the ceramic case 1, and the metal ring 10 is connected to the metal film 13. Normally, the metal film 13 is connected to earth or ground terminals in the mounting terminals 5 provided on the outer bottom face via through holes (electrode through holes) (not shown), to be so-called case grounding (see, for example, JP-A-2006-303919). Incidentally, reference numerals 12 in the drawing denote crystal holding terminals. Further, the notched parts 6c' (6b') in FIGS. 3A and 3B are respectively illustrated so as to be different in size for descriptive purposes.

However, in the related art surface-mounted oscillator, the through holes 6b and 6c in the sheet-like frame wall intermediate layer 11b and the sheet-like frame wall upper layer 11c are smaller than the through hole 6a in the sheet-like bottom wall layer 11a, and the both have steps therebetween, which has caused the following problem. That is, when the sheet-like ceramic case 11 is plated in an electrolyte, the steps formed by the through holes 6a and 6b in the sheet-like bottom wall layer 11a and the sheet-like frame wall intermediate layer 11b generate a liquid pool of the electrolyte in the step portions.

Accordingly, the plated layer formed on the inner circumferential surfaces of the sheet-like bottom wall layer 11a is made greater in thickness on its step portions to cause sags or the like. Thus, for example, this makes it difficult to divide the sheet-like ceramic case 11 without causing burrs or the like, which may cause a defective appearance or dust after soldering. The smaller the planar outline of the surface-mounted oscillator (ceramic case 1) is made, the more difficult it is for the electrolyte to infiltrate the through holes 6b and 6c in the sheet-like frame wall intermediate layer 11b and the sheet-like frame wall upper layer 11c, which compounds the problem.

SUMMARY OF THE INVENTION

An object of the invention is to provide a surface-mounted device in which end face electrodes for solder fillets are formed to have a uniform thickness and to have few burrs, so as to keep a width of a metal film on an end face of the openings or notched parts.

According to a first aspect of the invention, there is provided a surface-mounted device comprising: a ceramic case, which has a rectangular shape in a plan view, which has a concave portion formed by a bottom wall layer, a frame wall intermediate layer and a frame wall upper layer, which has a metal film on a surface of the frame wall upper layer serving as an end face of an opening of the concave portion, and which houses at least a crystal element inside the concave portion, the ceramic case being formed by dividing a sheet-like ceramic case, in which a sheet-like bottom wall layer, a sheet-like frame wall intermediate layer and a sheet-like frame wall upper layer are laminated, wherein the ceramic case comprises: arc-formed notched parts, which are formed so as to divide through holes provided at intersections on parting lines of the sheet-like case, at outer circumference four corners thereof; and mounting terminals, which are extended to notched parts in the bottom wall layer among the notched parts, on an outer bottom face thereof, wherein plated layers in an electrolyte are provided on surfaces of the mounting terminals, wherein a radius of curvature of the notched parts in the frame wall intermediate layer is made identical to or greater than a radius of curvature of the notched parts in the bottom wall layer, and wherein a radius of curvature of the notched parts in the frame wall upper layer is less than the radii of curvature of the notched parts in the bottom wall layer and the frame wall intermediate layer.

According to a second aspect of the invention, in the surface-mounted device, wherein the radii of curvature of the notched parts in the frame wall intermediate layer and the bottom wall layer are identical to one another.

According to the aspects of the invention, a radius of curvature of the notched parts in the frame wall intermediate layer is made identical to or greater than a radius of curvature of the notched parts in the bottom wall layer in the ceramic case. Accordingly, in the sheet-like ceramic case which has been divided into separate ceramic cases, the through holes in the sheet-like frame wall intermediate layer are made equal to or greater in diameter with respect to the through holes in the sheet-like bottom wall layer.

Thereby, even if the sheet-like ceramic case is submerged into an electrolyte, the electrolyte flows from the through holes in the sheet-like bottom wall layer into the through holes in the sheet-like frame wall intermediate layer. Therefore, since liquid pools of the electrolyte are not generated at all, burrs or the like do not occur when the sheet-like ceramic case is divided, which makes it possible to form end face electrodes uniform in thickness on the notched parts in the bottom wall layer after division.

Further, since the radius of curvature of the notched parts in the frame wall upper layer is made less than the radii of curvature of the notched parts in the bottom wall layer and the frame wall intermediate layer, it is possible to prevent an electric short-circuit with the metal film provided on the end face of the opening of the concave portion (surface of the frame wall upper layer) to keep a width of the metal film broad. For example, a metal ring for seam welding is fixed onto the metal film.

According to a second aspect of the invention, in the surface-mounted device according to the first aspect, the radii of curvature of the notched parts in the frame wall intermediate layer and the bottom wall layer are made identical to one another. Thereby, the configuration in the first aspect is further clarified.

BRIEF DESCRIPTION OF THE DRAWINGS

FIGS. 1A and 1B are diagrams for explanation of a surface-mounted oscillator according to one embodiment of the invention, in which FIG. 1A is a cross-sectional view of the surface-mounted oscillator and FIG. 1B is a plan view of the surface-mounted oscillator without a metal cover;

FIG. 2 is an enlarged partial plan view of a sheet-like ceramic case for explanation of the embodiment of the invention;

FIGS. 3A to 3C are diagrams for explanation of a related art surface-mounted oscillator, in which FIG. 3A is a cross-sectional view of the related art surface-mounted oscillator, FIG. 3B is a plan view of the related art surface-mounted oscillator without a metal cover, and FIG. 3C is a plan view of the related art surface-mounted oscillator to which the metal cover is jointed; and FIG. 4 is an enlarged partial plan view of a sheet-like ceramic case for explanation of the related art surface-mounted oscillator.

DETAILED DESCRIPTION OF THE PREFERRED EMBODIMENTS

Figure 1A:
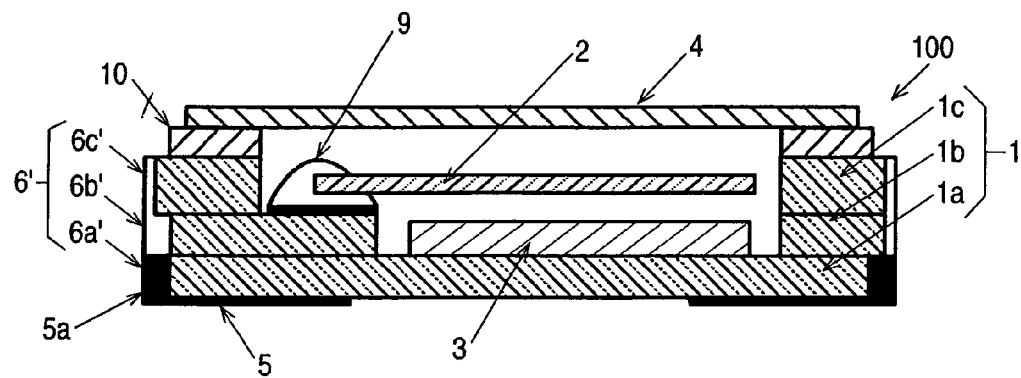
Figure 1B:
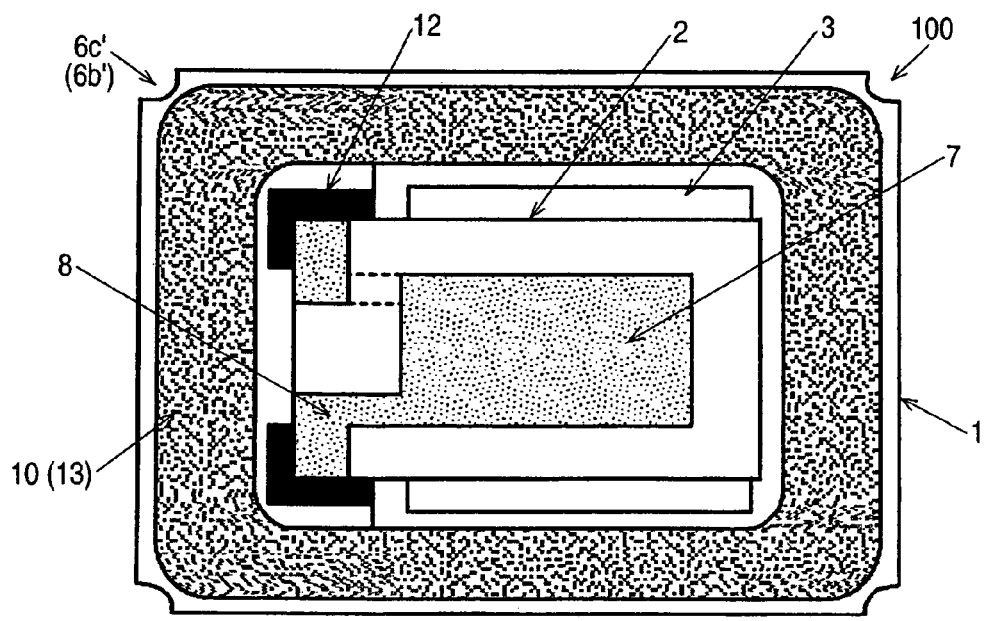

FIGS. 1A and 1B are diagrams for explanation of a surface-mounted oscillator according to one embodiment of the invention. Incidentally, portions which are the same as those in the related art are denoted by the same symbols, and descriptions thereof will be simplified or omitted.

A surface-mounted oscillator 100 according to the invention is configured such that a crystal element 2 and an IC chip 3 are housed in a ceramic case 1 which is composed of a bottom wall layer 1a, a frame wall intermediate layer 1b, and a frame wall upper layer 1c, that is formed to be concave so as to have an inner wall shoulder. The surface-mounted oscillator has a metal film on an end face of the opening (surface of the frame wall upper layer) of the concave portion, and has the mounting terminals 5 on its outer bottom face, and the end face electrodes 5a for forming solder fillets on the outer side faces of the bottom wall layer are extended therefrom (refer to FIGS. 1A and 1B).

In this example, the planar outline of the ceramic case 1 is 2.0×1.6 mm, and a width of the frame at a long side is 0.235 mm, and a width of the frame at a short side is 0.425 mm. In this example as well, the ceramic case 1 has the arc-formed notched parts 6' in the outer circumference four corners. Then, the notched parts 6' in the outer circumference four corners of the ceramic case 1 are formed to have a radius of curvature of 0.15 mm, that is identical in a radius of curvature of notched parts 6a' of the bottom wall layer 1a and a radius of curvature of notched parts 6b' of the frame wall intermediate layer 1b. Notched parts 6c' in the frame wall upper layer 1c are formed to have a radius of curvature of 0.1 mm which is smaller than that of the notched parts 6'.

The ceramic case 1 is formed, as shown in FIG. 2 (enlarged partial plan view), such that the sheet-like ceramic case 11 in which the sheet-like bottom wall layer 11a, the sheet-like frame wall intermediate layer 11b, and the sheet-like frame wall upper layer 11c are laminated is divided. The through holes 6 (6a, 6b and 6c) are provided in the intersections of the parting lines of the sheet-like ceramic case 11. Then, the through holes 6a and 6b in the sheet-like bottom wall layer 11a and the sheet-like frame wall intermediate layer 11b are made greater in diameter than the through holes 6c in the sheet-like frame wall upper layer 11c. That is, the notched parts 6a' and 6b' are made greater in radius of curvature than the notched parts 6c'.

Prior to being divided, the sheet-like ceramic case 11 is submerged into an electrolyte, and plated layers of Ni and Au are serially formed on base electrodes which have been formed and are exposed on the surface of the sheet-like ceramic case 11 including the through holes 6a in the sheet-like bottom wall layer 11a in a manner such as discussed above regarding the related art. Thereafter, the sheet-like ceramic case 11 is divided into separate ceramic cases 1.

Then, the IC chip 3 is fixed to the inner bottom face of the ceramic case 1 by flip-chip bonding, and the both sides of one end of the crystal element 2 are fixed to the inner wall shoulders by an electrically conductive adhesive 9. Then, the metal cover 4 is jointed by seam welding to the metal ring 10 provided to the metal film 13 on the end face of the opening of the ceramic case 1 to hermetically encapsulate it (refer to FIG. 1B for a reference numeral of the metal film 13).

Figure 3A:
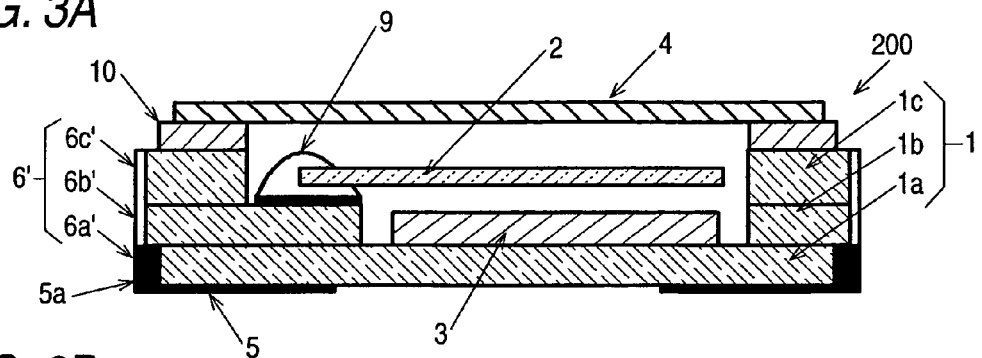
Figure 3B:
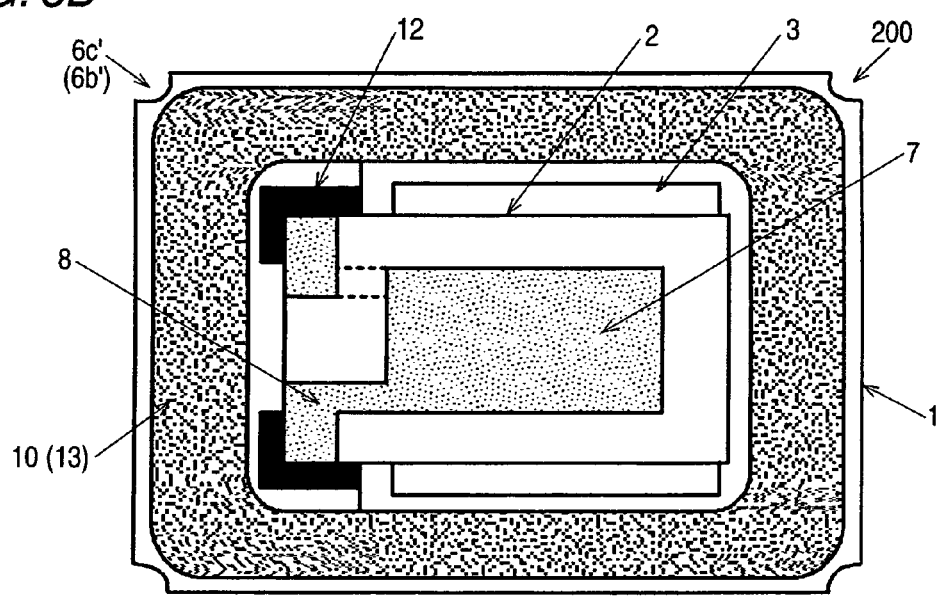
Figure 3C:
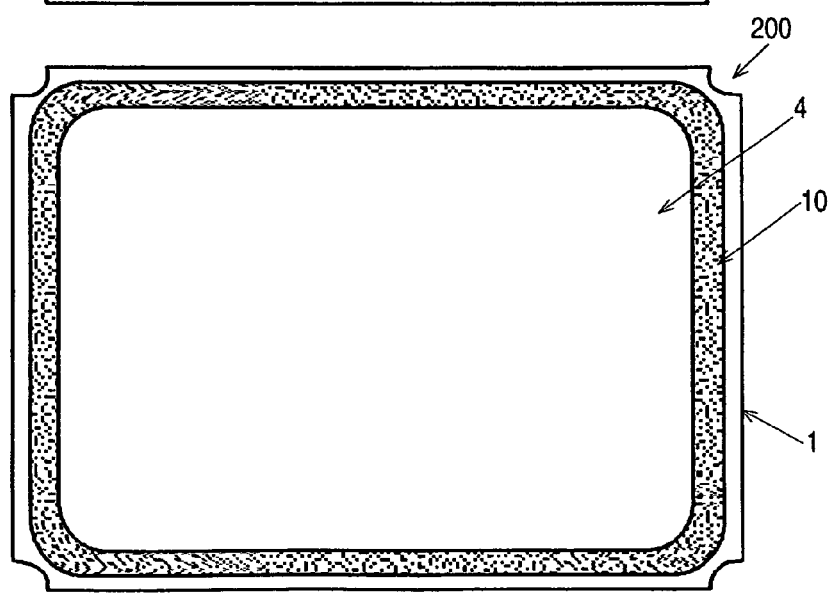

In such a device, the diameters of the through holes 6a and 6b (the radii of curvature of the notched parts 6a' and 6b' after division) in the sheet-like bottom wall layer 11a and the sheet-like frame wall intermediate layer 11b are made identical to one another, which does not generate steps between the through holes 6a, 6b unlike the related art in FIGS. 3A-4. Accordingly, when the sheet-like ceramic case 11 is submerged into an electrolyte, it is easy for the electrolyte to flow from the sheet-like bottom wall layer 11a into the sheet-like frame wall intermediate layer 11b, which does not include a step portion that could generate a liquid pool therein.

Thereby, plated layers of Ni and Au are formed to have a uniform thickness on the base electrodes of tungsten (W) formed in advance on the inner circumferences of the through holes 6a in the sheet-like bottom wall layer 11a. Incidentally, since the base electrodes are not formed on the inner circumferences of the sheet-like frame wall intermediate layer 11b, plated layers of Ni and Au are not formed thereon.

From these reasons, when the sheet-like ceramic case 11 is divided to obtain the separate ceramic cases 11, burrs and the like do not occur, that prevents defective appearances of the ceramic cases 1 and dust from being generated thereafter. Further, since the radius of curvature of only the notched parts 6b' of the frame wall intermediate layer 1b (i.e., the diameter of the through holes 6b of the sheet-like frame wall intermediate layer 11b) is made greater, and the radius of curvature of the notched parts 6c' of the frame wall upper layer 1c (i.e., the diameter of the through holes 6c of the sheet-like frame wall upper layer 11c) is made smaller, a width of the metal film 13 on the end face of the opening can be kept in the same way as in the related art. Thereby, for example, sealing paths with the metal ring 10 by seam welding are retained to be large, which ensures airtightness.

In the above-described embodiment, the metal ring 10 is provided to the metal film 13 on the end face of the opening as seam welding. Alternatively, since a width of the metal film 13 can be kept, for example, even by direct seam welding in which a thickness of the metal film is broadened instead of using the metal ring 10 or by jointing with a eutectic alloy, the same advantageous effects are performed even in these cases. Further, the crystal device has been described as a surface-mounted oscillator. However, this invention is not limited thereto, and it is a matter of course that the crystal device may be applied even to a surface-mounted unit in which only a crystal element is housed.

What is claimed is:

1. A surface-mounted device comprising:
    a ceramic case, which has a rectangular shape in a plan view, which has a concave portion formed by a bottom wall layer, a frame wall intermediate layer and a frame wall upper layer, which has a metal film on a surface of the frame wall upper layer serving as an end face of an opening of the concave portion, and which houses at least a crystal element inside the concave portion, the ceramic case being formed by dividing a sheet-like ceramic case, in which a sheet-like bottom wall layer, a sheet-like frame wall intermediate layer and a sheet-like frame wall upper layer are laminated,
    wherein the ceramic case comprises:
        arc-formed notched parts, which are formed so as to divide through holes provided at intersections on parting lines of the sheet-like case, at outer circumference four corners thereof; and
        mounting terminals, which are extended to notched parts in the bottom wall layer among the notched parts, on an outer bottom face thereof,
    wherein plated layers are formed on base electrodes on an outer bottom face of the sheet-like ceramic case in an electrolyte so as to form the mounting terminals,
    wherein a radius of curvature of the notched parts in the frame wall intermediate layer is made identical to or greater than a radius of curvature of the notched parts in the bottom wall layer, and
    wherein a radius of curvature of the notched parts in the frame wall upper layer is less than the radii of curvature of the notched parts in the bottom wall layer and the frame wall intermediate layer.

2. The surface-mounted device according to claim 1, wherein the radii of curvature of the notched parts in the frame wall intermediate layer and the bottom wall layer are identical to one another.

3. The surface-mounted device according to claim 1, wherein the base electrodes are formed only to the sheet-like bottom wall layer, and
    wherein the plated layers are formed on the base electrodes in the electrolyte so as to form the mounting terminals only to the sheet-like bottom wall layer.

4. The surface-mounted device according to claim 1, wherein the mounting terminals extended to the notched parts in the bottom wall layer form end face electrodes, and
    wherein the end face electrodes have a substantially uniform thickness.

5. The surface-mounted device according to claim 1, wherein the surface-mounted device is configured to be directly mounted to a substrate surface via solder fillets.

* * * * *